United States Patent
Simonis et al.

(10) Patent No.: US 12,253,570 B2
(45) Date of Patent: Mar. 18, 2025

(54) METHOD FOR DETERMINING A STATE OF HEALTH OF AT LEAST ONE ELECTROCHEMICAL ENERGY STORE

(71) Applicant: Robert Bosch GmbH, Stuttgart (DE)

(72) Inventors: Christian Simonis, Leonberg (DE); Christoph Woll, Gerlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 325 days.

(21) Appl. No.: 17/788,457

(22) PCT Filed: Feb. 18, 2021

(86) PCT No.: PCT/EP2021/053977
§ 371 (c)(1),
(2) Date: Jun. 23, 2022

(87) PCT Pub. No.: WO2021/170476
PCT Pub. Date: Sep. 2, 2021

(65) Prior Publication Data
US 2023/0040199 A1 Feb. 9, 2023

(30) Foreign Application Priority Data
Feb. 28, 2020 (DE) .................. 10 2020 202 561.4

(51) Int. Cl.
*G01R 31/392* (2019.01)
*G01R 31/388* (2019.01)
(52) U.S. Cl.
CPC ......... *G01R 31/392* (2019.01); *G01R 31/388* (2019.01)

(58) Field of Classification Search
CPC ...... G01R 31/392; G01R 31/388; Y02E 60/10
See application file for complete search history.

(56) References Cited

U.S. PATENT DOCUMENTS

| | | |
|---|---|---|
| 2009/0228225 A1 | 9/2009 | Burgess |
| 2010/0090650 A1 | 4/2010 | Yazami et al. |
| 2015/0293181 A1 | 10/2015 | Kaneno et al. |
| 2020/0036197 A1 | 1/2020 | Tan |

FOREIGN PATENT DOCUMENTS

| | | |
|---|---|---|
| CN | 102185167 A | 9/2011 |
| CN | 103943871 A | 7/2014 |
| CN | 106526486 A | 3/2017 |
| DE | 10201136 C1 | 6/2003 |
| EP | 1845386 A2 | 10/2007 |
| WO | 2019234390 A1 | 12/2019 |

OTHER PUBLICATIONS

International Search Report for PCT/EP2021/053977, Issued May 21, 2021.
WikipediA: "Battery management system", Jul. 19, 2022, pp. 1-6; https://en.wikipedia.org/w/index.php?title=Battery_management_system&oldid=1099134293.

*Primary Examiner* — An H Do
(74) *Attorney, Agent, or Firm* — NORTON ROSE FULBRIGHT US LLP; Gerard A. Messina

(57) ABSTRACT

A method for determining a state of health of at least one electrochemical energy store includes bringing the electrochemical energy store to a predefined voltage state, after which the electrochemical energy store is discharged for a predefined time period and using predefined electric currents, and determining a rate of voltage change during the discharge, on the basis of which the state of health is determined.

10 Claims, 3 Drawing Sheets

METHOD FOR DETERMINING A STATE OF HEALTH OF AT LEAST ONE ELECTROCHEMICAL ENERGY STORE

FIELD

The present invention relates to a method for determining a state of health of at least one electrochemical energy store, a diagnostic device, a computer program and also a use of the diagnostic device.

BACKGROUND INFORMATION

An ageing state (state of health, SOH) of a battery whose values are calculated and stored in a battery control unit (BCU) is read out, for instance in an auto repair shop in the course of an inspection of an electrically drivable vehicle that includes the battery, via a diagnosis interface (onboard diagnosis interface, OBD interface) with the aid of a diagnostic device.

Depending on the SOH algorithm, these values were determined during or after driving cycles, during or after charging processes, in dynamic or stationary states, under different conditions.

Every manufacturer uses a different method and sometimes there are even differences between the same vehicle models or battery models, and the service facilities rely on the value of the state of health with a correspondingly large inaccuracy or accuracy.

U.S. Patent Application Publication No. US 2010/090650 describes systems and methods for the precise characterization of the thermodynamic and material properties of electrodes and electrochemical energy stores and energy conversion systems.

China Patent Application CN 106526486 describes a method for detecting the ageing degree of a lithium battery.

It is an object of the present invention to further improve the related art. This object may be achieved by the features of the present invention.

SUMMARY

The approach disclosed herein may have the advantage that the method for determining the state of health of at least one electrochemical energy store includes the following steps according to an example embodiment of the present invention:
a) acquiring a voltage variable which represents an electric voltage of the electrochemical energy store;
b) comparing the acquired voltage variable with a predefined setpoint voltage variable;
c) generating signals for charging and/or discharging the electrochemical energy store based on the result of the comparison;
d) discharging the electrochemical energy store for a predefined time period using small electric currents;
e) acquiring the voltage variable during the discharging and determining a voltage gradient of the acquired voltage variable for the predefined time period;
f) comparing the voltage gradient with predefined setpoint voltage gradients;
g) determining the state of health of the electrochemical energy store based on the result of the comparison.

In this way, the state of health of the electrochemical energy store is determined in a highly precise manner at a defined charge state so that a reliable prediction about the service life and the cost-effectiveness is able to be made for the electrochemical energy store, e.g., when repairing or exchanging the electrochemical energy store.

It is furthermore advantageous that the method according to the present invention is able to be used as a standard testing method for electrochemical energy stores having a particular voltage characteristic. This also achieves a comparability of different electrochemical energy stores, which is of interest for possible second life applications of the energy stores, in particular.

Additional advantageous embodiments of the present invention are disclosed herein.

In an advantageous manner, a method of an example embodiment of the present invention furthermore includes the following steps:
a.1) acquiring a temperature variable which represents a temperature of the electrochemical energy store;
a.2) comparing the acquired temperature variable with a predefined setpoint temperature variable;
a.3) generating signals for heating and/or cooling the electrochemical energy store based on the result of the comparison.

This makes it possible to carry out the method according to the present invention at fixedly defined temperatures so that no temperature control by the electrochemical energy store is necessary.

In addition, the method includes the following advantageous step:
c.1) waiting for a predefined period for the relaxation of the electrochemical energy store.

In this way it is possible to perform the method according to the present invention at defined and virtually identical conditions, which achieves a greater accuracy and comparability in comparison with the related art.

In addition, the method in accordance with an example embodiment of the present invention further includes the following advantageous steps:
e.1) discharging the electrochemical energy store for a further predefined time period using small electric currents;
e.2) repeating the steps d) and e) at least once;
e.3) determining a voltage gradient from a mean value of the determined voltage gradients.

This makes it possible to carry out the method according to the present invention in a fully automatic manner so that systematic or random measuring deviations are able to be excluded.

In addition, the method in accordance with an example embodiment of the present invention further includes the following advantageous step:
h) validating the state of health by evaluating the voltage variable during the discharging and/or the relaxation of the electrochemical energy store and/or by evaluating the voltage characteristic following a current jump.

This makes it possible to validate the determined state of health by further methods and to determine it in a highly precise manner. A highly precise state of health offers enormous advantages in particular for a vehicle owner and/or for a fleet operator as far as the service life of the electrochemical energy store or of an electrically drivable vehicle including the electrochemical energy store is concerned.

In addition, the method in accordance with an example embodiment of the present invention further includes the following advantageous steps:
i) acquiring a further voltage variable which represents an electric voltage of the electrochemical energy store;

j) comparing the acquired further voltage variable with the voltage variable acquired in step a);

k) generating signals for charging and/or discharging the electrochemical energy store based on the result of the comparison.

Virtually no losses arise from the buffering of energy or the energetic recovery from an electrical network when the method according to the present invention is carried out.

In an advantageous manner, in accordance with an example embodiment of the present invention, a diagnostic device includes at least one means, in particular an electronic control device, which is designed to carry out the steps of the method according to the present invention.

As a result, no intervention in a control unit is required such as a control unit of the electrochemical energy store (battery control unit, BCU) or a control unit of the electrically drivable vehicle (vehicle control unit, VCU). In a further advantageous embodiment, a reconciliation of the determined state of health with the control unit and/or an infrastructure can be performed in a wired and/or wireless manner.

In addition, a repair facility, for instance, is given the capability of determining a reliable and highly precise state of health for electrochemical energy stores of practically any electrically drivable vehicle under defined conditions. With the aid of this standardized method, a comparability of different electrochemical energy stores is provided, which is of interest in particular for possible second life applications of the energy stores.

A computer program according to the present invention advantageously includes instructions that induce the diagnostic device to carry out the method steps according to the present invention for the identification internal short-circuits.

A machine-readable storage medium on which the computer program is stored is advantageously provided.

In an advantageous manner, the diagnostic device is used for electric vehicles, hybrid vehicles, plug-in hybrid vehicles, airplanes, pedelecs or electric bikes, electric hand-held tools and also for stationary accumulators for storing regeneratively generated energy, in particular.

BRIEF DESCRIPTION OF THE DRAWINGS

Exemplary embodiments of the present invention are illustrated in the figures and discussed in greater detail in the following description.

DETAILED DESCRIPTION OF EXAMPLE EMBODIMENTS

Figure 1:
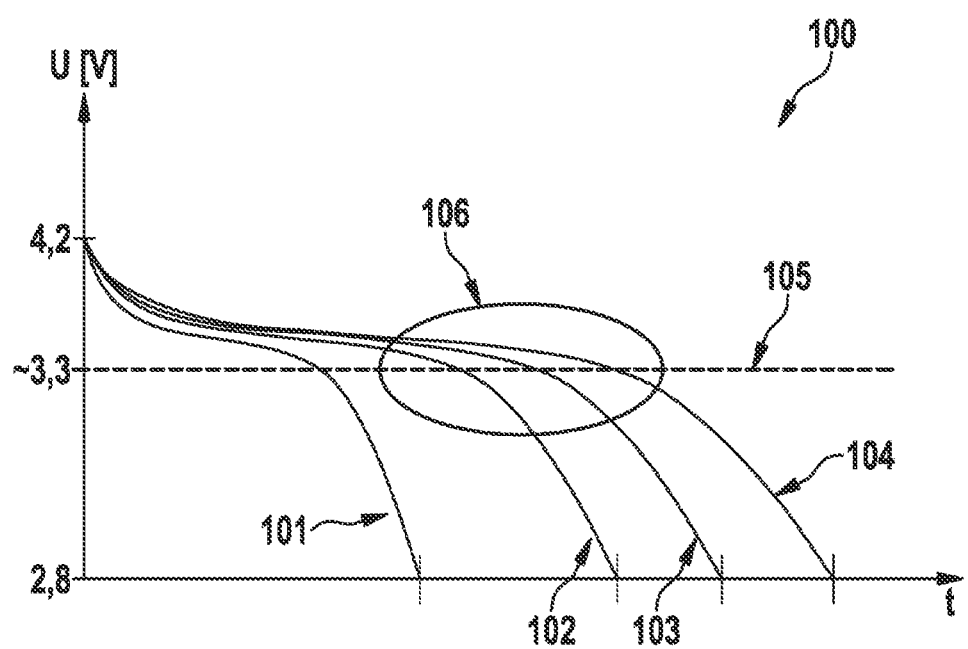
FIG. 1 shows a first schematic illustration of voltage characteristics of electrochemical energy stores having different states of health.

Identical reference numerals denote the same device components in all of the figures.

FIG. 1 shows a first schematic illustration of voltage characteristics 100 of electrochemical energy stores having different states of health according to a respective state of health that corresponds to a ratio of the currently maximally usable capacity to the nominal capacity of the electrochemical energy stores. Voltage characteristic 101 is characteristic of an electrochemical energy store having a state of health of 60%, voltage characteristic 102 is characteristic of an electrochemical energy store having a state of health of 80%, voltage characteristic 103 is characteristic of an electrochemical energy store having a state of health of 90%, and voltage characteristic 104 is characteristic of an electrochemical energy store having a state of health of 100%.

A predefined electric voltage 105 intersects voltage characteristics 101, 102, 103, 104 in voltage-sensitive points 106 as a function of the state of health at a specified temperature.

Figure 2:
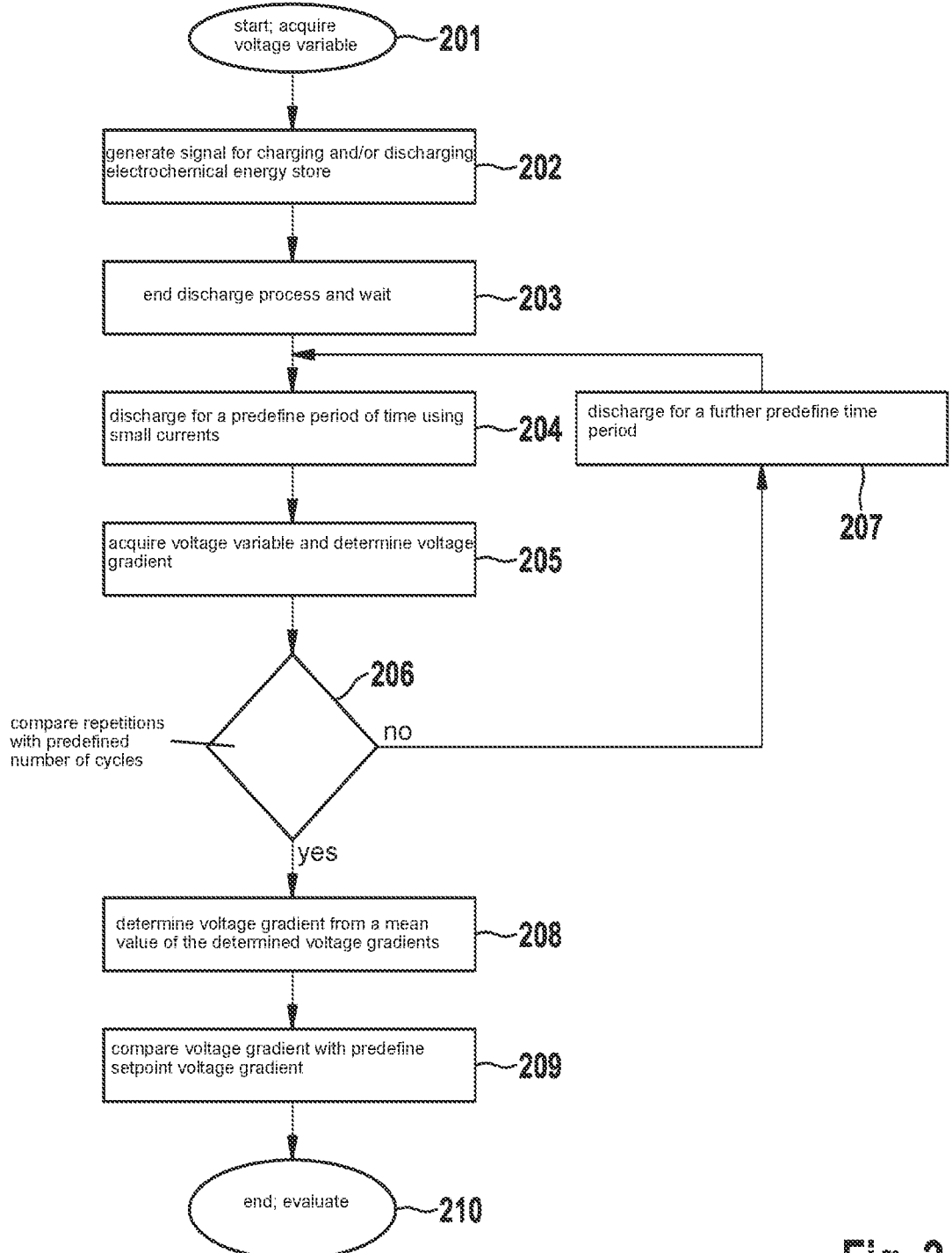
FIG. 2 shows a flow diagram of an example embodiment of a method according to the present invention.

FIG. 2 shows a flow diagram of an embodiment of a method according to the present invention. The method is started in step 201, for instance when a diagnostic device in a workshop is connected to a diagnosis interface of an electrically drivable vehicle having an electrochemical energy store.

In addition, a voltage variable is acquired in step 201, which represents an electric voltage of the electrochemical energy store, and the acquired voltage variable is compared with a predefined setpoint voltage variable.

Moreover, a temperature of the electrochemical energy store and a state of health are acquired from a control unit, e.g., a control unit of the electrochemical energy store (battery control unit, BCU) or a control unit of the electrically drivable vehicle (vehicle control unit, VCU). The determination of the state of health is preferably conducted at a defined constant temperature such as 20° C. For this purpose, the electrochemical energy store or the electrically drivable vehicle having the electrochemical energy store is able to be parked in a climate chamber or be exposed to the flow of a blower.

In step 202, a signal for the charging and/or discharging of the electrochemical energy store is generated based on the result of the comparison of the acquired voltage variable with the predefined setpoint voltage variable.

In this way, the electric voltage of the electrochemical energy store is adjusted to a voltage level at which the sensitivity of the electric voltage of the electrochemical energy store is at its maximum. The sensitivity differs as a function of a cell chemistry of the electrochemical energy store, and the electric voltage does not necessarily lie at the same voltage level for all states of health but may vary as a function of the state of health.

The state of health acquired from the control unit is used as a reference value based on which the method according to the present invention is started. The setpoint voltage variable results from the acquired state of health, e.g., based on technical data of the electrical energy store stored in the diagnostic device. The electrochemical energy store is charged or discharged as a function of the comparison of the acquired voltage variable with the predefined setpoint voltage variable.

In the simplest case, the discharging of the electrochemical energy is performed by switching on consumers such as an air-conditioning or heating system if a deviation of the current voltage variable from the setpoint voltage variable is very small.

In the other case, the electrochemical energy store is connected to a buffer battery and discharged until the setpoint voltage variable is reached.

Moreover, a connection to a charge station is possible as well, in which case the excess energy of the electrochemical energy store is fed into a current network. At the end of the method, buffered or recirculated energy is conveyed to the electrochemical energy store again so that practically no energy is lost and the electrochemical energy store has the same state of charge (SOC) after the state of health has been determined.

When the predefined voltage variable is reached, the discharge process is ended and a wait for a predefined period of time takes place in step 203 during which the electrochemical energy store relaxes. The electric voltage of the electrochemical energy store rises as a result but still lies in a range close to the setpoint voltage variable.

In step 204, the electrochemical energy store is discharged for a predefined period of time using small currents, e.g., 0.1 C to 0.5 C. If the charge station does not permit such small adjustable currents, then a small load such as a consumer or resistor is able to be connected directly to the electrochemical energy store. During the discharging operation, the voltage variable is acquired and in step 205 a voltage gradient is determined based on a characteristic of the acquired voltage variable for the predefined time period.

In step 207, the electrochemical energy store is discharged for a further predefined time period using small electric currents. After a short measuring pause with the further discharging, steps 204 and 205 are repeated for as long as the voltage variable is still in the predefined voltage range, e.g., between 3.4 V and 3.2 V. A certain number of repetitions should be carried out for tolerance-related reasons, for which purpose the number of repetitions is compared with a predefined number of cycles in step 206.

In step 208, a voltage gradient is determined from a mean value of the determined voltage gradients when the predefined number of cycles is reached.

In step 209, the voltage gradient is compared with a predefined setpoint voltage gradient, and the state of health of the electrochemical energy store is determined based on the result of the comparison.

In step 210, the method is terminated. In a further advantageous embodiment, the state of health is validated in step 210 by evaluating the voltage variable during the discharge and/or the relaxation of the electrochemical energy store and/or by evaluating a voltage characteristic after a voltage jump.

In a further advantageous embodiment, a further voltage variable is acquired in step 210, the acquired further voltage variable is compared with the voltage variable acquired in step 201, and signals for charging and/or discharging the electrochemical energy store are generated based on the result of the comparison. The electrochemical energy store therefore has the same state of charge (SOC) as at the start of the method in step 201 after the state of health has been determined and the end of the method in step 210.

Figure 3:
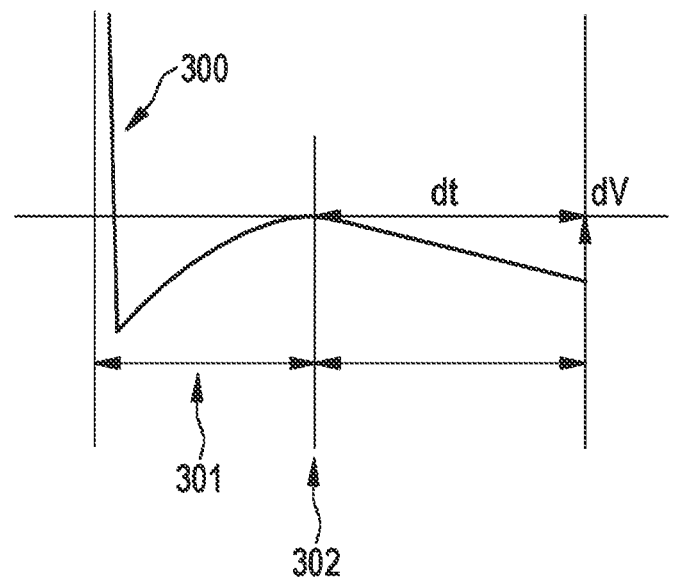
FIG. 3 shows a schematic illustration of a voltage characteristic after a discharge operation of an electrochemical energy store.

FIG. 3 shows a schematic representation of a voltage characteristic 300 following a discharge operation of the electrochemical energy store according to step 202. If the predefined setpoint voltage variable is reached, then the discharging operation of the electrochemical energy store is ended. The electrochemical energy store relaxes within a predefined time period 301. The electric voltage rises slightly again during the predefined time period in step 203. A measurement of the electric voltage according to step 204 is able to be carried out at an instant 302.

Figure 4:
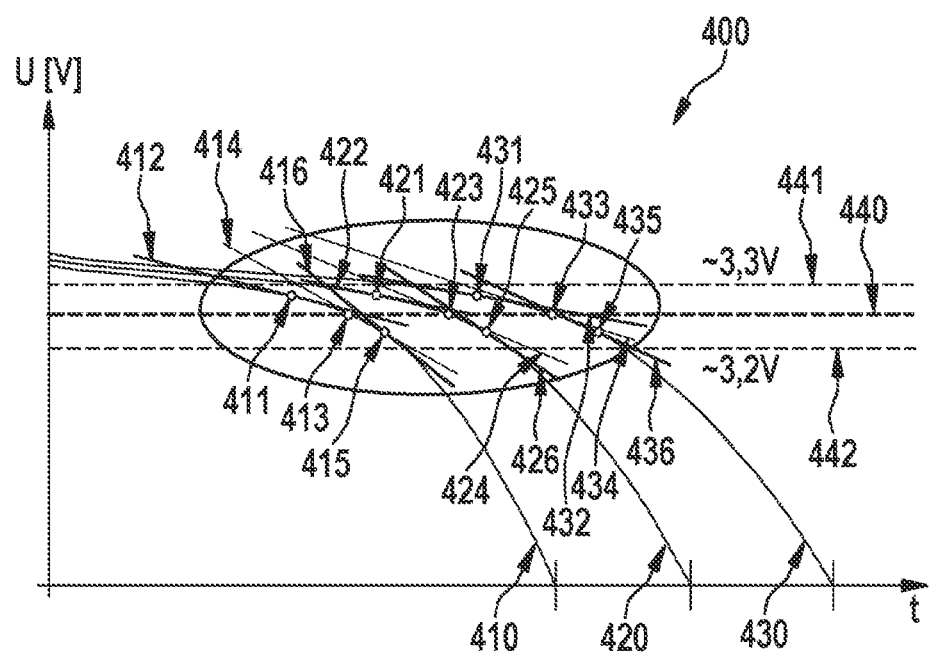
FIG. 4 shows a second schematic illustration of voltage characteristics of electrochemical energy stores having different states of health.

FIG. 4 shows a second schematic illustration of voltage characteristics 400 of electrochemical energy stores having different states of health, according to a respective state of health that corresponds to a ratio of the currently maximally usable capacity to the nominal capacity of the electrochemical energy stores. Voltage characteristic 410 is characteristic of an electrochemical energy store having a state of health of 80%. Voltage characteristic 420 is characteristic of an electrochemical energy store having a state of health of 90%. Voltage characteristic 430 is characteristic of an electrochemical energy store having a state of health of 100%.

To determine the state of health of the electrochemical energy store according to the present invention, an electric voltage 440 is predefined, which intersects the voltage characteristics 410, 420, 430 in voltage-sensitive points 413, 423, 433 as a function of the state of health at a specified temperature. Depending on the state of health, voltage-sensitive points 411, 413, 415, 421, 423, 425, 431, 433, 435 may shift between predefined electric voltage limits 441, 442.

In step 202, the electrochemical energy store is discharged to a setpoint voltage variable 440 such as approximately 3.3 V. The electric voltage rises slightly in response to the relaxation of the electrochemical energy store. In step 204, the electrochemical energy store is discharged for a predefined period of time. In step 205, a first voltage gradient 412, 422, 432 is determined. In step 207, the electrochemical energy store is discharged for a further predefined period of time using small currents, which causes the electric voltage to drop. Steps 204 and 205 are now repeated and a second voltage gradient 414, 424, 434 is determined. In a third cycle, a third voltage gradient 416, 426, 436 is determined. In step 208, the voltage gradient is determined from a mean value of the determined voltage gradients 412, 422, 432, 414, 424, 434, 416, 426, 436. In step 209, the voltage gradient is compared with a predefined setpoint voltage gradient and the state of health of the electrochemical energy store is determined based on the result of the comparison.

What is claimed is:

1. A method for determining a state of health of at least one electrochemical energy store, the method comprising the following steps:
   a) measuring a value of a voltage of the electrochemical energy store;
   b) comparing the measured value to a predefined setpoint value for the voltage;
   c) changing a charge state of the electrochemical energy store by, depending on a result of the comparison of step b), either charging or discharging the electrochemical energy store, to thereby bring the electrochemical energy store into a predefined state in which the electrochemical energy store has the predefined setpoint value for the voltage;
   d) based on, and subsequent to, the predefined state being reached, discharging the electrochemical energy store for a predefined time period using predefined electric currents;
   e) measuring values of the voltage of the electrochemical energy store during the discharging of step d);
   f) determining, based on the values of the voltage obtained by the measuring of step e), a rate at which the voltage of the electrochemical energy store changed over the predefined time period;
   g) comparing a value of the determined rate with predefined setpoint rates; and
   h) determining the state of health of the electrochemical energy store based on a result of the comparison in step g).

2. The method for determining a state of health of an electrochemical energy store as recited in claim 1, further comprising the following steps:
   a.1) acquiring a temperature variable which represents a temperature of the electrochemical energy store;

a.2) comparing the acquired temperature variable with a predefined setpoint temperature variable; and a.3) generating signals for heating and/or cooling the electrochemical energy store based on the result of the comparison in step a.2).

3. The method for determining a state of health of an electrochemical energy store as recited in claim 1, further comprising the following step:

c.1) waiting for a predefined time for a relaxation of the electrochemical energy store from when the predefined state is reached in step c) until performance of step d).

4. The method for determining a state of health of an electrochemical energy store as recited in claim 1, further comprising the following steps:

e.1) discharging the electrochemical energy store for a further predefined time period using predefined currents;

e.2) repeating the steps d) and e) at least once;

e.3) determining a mean value of the rates, wherein mean value is used as the value in the comparison of step g).

5. The method for determining a state of health of an electrochemical energy store as recited in claim 1, further comprising the following step:

i) validating the state of health by evaluating the voltage during the discharging of step d) and/or during a relaxation of the electrochemical energy store for a predefined amount of time from when the predefined state is reached in step c) until performance of step d) and/or by evaluating a voltage characteristic following a current jump.

6. The method for determining a state of health of an electrochemical energy store as recited in claim 1, further comprising the following steps:

i) acquiring a further value of the voltage of the electrochemical energy store;

j) comparing the acquired further value of the voltage with the value of the voltage measured in step a);

k) generating signals for either charging and/or discharging the electrochemical energy store depending on the result of the comparison in step j).

7. The method for determining a state of health of an electrochemical energy store as recited in claim 1, wherein the predefined electric currents are limited to a predefined rage of 0.1 C to 0.5 C.

8. A diagnostic device, comprising:

an electronic control device configured to determine a state of health of at least one electrochemical energy store, the electronic control device configured to:

a) measure a value of a voltage of the electrochemical energy store;

b) compare the measured value to a predefined setpoint value for the voltage;

c) change a charge state of the electrochemical energy store by, depending on a result of the comparison of step b), either charging or discharging the electrochemical energy store, to thereby bring the electrochemical energy store into a predefined state in which the electrochemical energy store has the predefined setpoint value for the voltage;

d) based on and subsequent to the predefined state being reached, discharge the electrochemical energy store for a predefined time period using predefined electric currents;

e) measure values of the voltage of the electrochemical energy store during the discharging of step d);

f) determine, based on the values of the voltage obtained by the measuring of step e), a rate at which the voltage of the electrochemical energy store changed over the predefined time period;

g) compare the determined rate with predefined setpoint rates; and h) determine the state of health of the electrochemical energy store based on a result of the comparison in step g).

9. The diagnostic device as recited in claim 8, wherein the diagnostic device is configured to diagnose an electric vehicle, or a hybrid vehicle, or a plug-in hybrid vehicle, or an airplane, or a pedelec or an electric bike, or an electric handheld tool, or a stationary accumulators for storing regeneratively obtained electrical energy.

10. A non-transitory machine-readable memory medium on which is stored a computer program for determining a state of health of at least one electrochemical energy store, the computer program, when executed by a computer, causing the computer to perform the following steps:

a) measuring a value of a voltage of the electrochemical energy store;

b) comparing the measured value to a predefined setpoint value for the voltage;

c) changing a charge state of the electrochemical energy store by, depending on a result of the comparison of step b), either charging or discharging the electrochemical energy store, to thereby bring the electrochemical energy store into a predefined state in which the electrochemical energy store has the predefined setpoint value for the voltage;

d) based on and subsequent to the predefined state being reached, discharging the electrochemical energy store for a predefined time period using predefined electric currents;

e) measuring values of the voltage of the electrochemical energy store during the discharging of step d);

f) determining, based on the values of the voltage obtained by the measuring of step e), a rate at which the voltage of the electrochemical energy store changed over the predefined time period;

g) comparing the determined rate with predefined setpoint rates; and h) determining the state of health of the electrochemical energy store based on a result of the comparison in step g).

* * * * *